US008841761B2

(12) United States Patent
Kim

(10) Patent No.: US 8,841,761 B2
(45) Date of Patent: Sep. 23, 2014

(54) ORGANIC LIGHT EMITTING DIODE DISPLAY

(71) Applicant: Samsung Display Co., Ltd., Yongin (KR)

(72) Inventor: Hwan-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/910,042

(22) Filed: Jun. 4, 2013

(65) Prior Publication Data

US 2014/0077181 A1 Mar. 20, 2014

(30) Foreign Application Priority Data

Sep. 19, 2012 (KR) ........................ 10-2012-0103952

(51) Int. Cl.
*H01L 23/18* (2006.01)
*H01L 23/053* (2006.01)
*H01L 23/06* (2006.01)
*H01L 27/32* (2006.01)
*H01L 27/30* (2006.01)
*G02F 1/1335* (2006.01)
*H01L 51/52* (2006.01)

(52) U.S. Cl.
CPC .............. *H01L 27/32* (2013.01); *H01L 27/307* (2013.01); *G02F 1/133608* (2013.01); *H01L 51/524* (2013.01)
USPC .............................. 257/687; 257/40; 257/724

(58) Field of Classification Search
None
See application file for complete search history.

(56) References Cited

U.S. PATENT DOCUMENTS

| 4,851,286 | A | * | 7/1989 | Maurice | 428/316.6 |
| 7,390,563 | B2 | * | 6/2008 | Kadoya et al. | 428/319.3 |
| 8,324,804 | B2 | * | 12/2012 | Kim | 313/504 |
| 2011/0242743 | A1 | * | 10/2011 | Moon | 361/679.01 |
| 2012/0088091 | A1 | | 4/2012 | Zoller | |
| 2012/0170244 | A1 | * | 7/2012 | Kwon et al. | 361/829 |
| 2014/0042406 | A1 | * | 2/2014 | Degner et al. | 257/40 |

FOREIGN PATENT DOCUMENTS

| KR | 10-2006-0033217 | 4/2006 |
| KR | 10-2007-0034806 | 3/2007 |
| KR | 10-2007-0120287 | 12/2007 |
| KR | 10-2012-0023897 | 3/2012 |
| KR | 10-2012-0039630 | 4/2012 |

* cited by examiner

*Primary Examiner* — Thomas L Dickey
*Assistant Examiner* — Joseph Schoenholtz
(74) *Attorney, Agent, or Firm* — Christie, Parker & Hale, LLP

(57) ABSTRACT

An organic light emitting diode (OLED) display according to an exemplary embodiment includes: a display substrate; an organic light emitting element on the substrate; a sealing member covering the organic light emitting element; a sealant formed between a surrounding portion of the display substrate and a surrounding portion of the sealing member; and an impact absorption layer under the display substrate, wherein an area ratio of the impact absorption agent in the impact absorption layer increases from the surrounding portion of the display substrate to a center of the display substrate such that the impact absorption ratio of the outer portion of the surrounding impact absorption layer is higher than the impact absorption ratio of the center impact absorption layer, and accordingly, damage to the surrounding portion of the display substrate that is weak against external impact may be prevented.

17 Claims, 8 Drawing Sheets

ORGANIC LIGHT EMITTING DIODE DISPLAY

CROSS-REFERENCE TO RELATED APPLICATION

This application claims priority to and the benefit of Korean Patent Application No. 10-2012-0103952, filed in the Korean Intellectual Property Office on Sep. 19, 2012, the entire content of which is incorporated herein by reference.

BACKGROUND

1. Field

The described technology relates generally to an organic light emitting diode (OLED) display.

2. Description of the Related Art

An organic light emitting diode (OLED) display includes an organic light emitting panel that includes an organic light emitting element. The organic light emitting element includes a plurality of OLEDs each formed of a hole injection electrode, an organic emission layer, and an electron injection electrode. Each OLED emits light by energy generated when excitons generated as electrons and holes are combined and dropped from an excited state to a ground state, and the OLED display displays an image by using the light.

An organic light emitting panel including the organic light emitting element is installed in an exterior frame, and to prevent damage to the organic light emitting panel from an external impact, an impact absorption layer is installed between the exterior frame and the organic light emitting panel.

However, even if the impact absorption layer is installed, damage may still be easily generated at a sealant portion near the organic light emitting panel that is relatively weak against external impact.

The above information disclosed in this Background section is only for enhancement of understanding of the background of the described technology and therefore it may contain information that does not form the prior art that is already known in this country to a person of ordinary skill in the art.

SUMMARY

An aspect of an embodiment of the present invention is directed toward an organic light emitting diode (OLED) display that is protected against damage by an external impact.

An organic light emitting diode (OLED) display according to an exemplary embodiment includes: a display substrate; an organic light emitting element formed on the substrate; a sealing member covering the organic light emitting element; a sealant formed between a surrounding portion of the display substrate and a surrounding portion of the sealing member; and an impact absorption layer formed under the display substrate, wherein an area ratio of an impact absorption agent formed in the impact absorption layer increases from the surrounding portion of the display substrate to a center of the display substrate.

The impact absorption layer may include a center impact absorption layer formed at a position corresponding to the center of the display substrate, and a surrounding impact absorption layer formed at a position corresponding to the surrounding portion of the display substrate and having a higher impact absorption ratio than the center impact absorption layer.

The center impact absorption layer may include the impact absorption agent, and the surrounding impact absorption layer may include the impact absorption agent and an impact-absorbing opening formed at the impact absorption agent.

The impact-absorbing opening may be a plurality of impact-absorbing holes.

The area ratio of the plurality of impact-absorbing holes formed in the surrounding impact absorption layer may decrease from an outer portion of the surrounding impact absorption layer to an inner portion of the surrounding impact absorption layer.

The size of the plurality of impact-absorbing holes may decrease from an outer portion of the surrounding impact absorption layer to an inner portion of the surrounding impact absorption layer.

The hole interval between the plurality of impact-absorbing holes may increase from an outer portion of the surrounding impact absorption layer to an inner portion of the surrounding impact absorption layer.

The impact-absorbing opening may be a plurality of impact-absorbing opening lines.

The area ratio of the plurality of impact-absorbing opening lines formed in the surrounding impact absorption layer may decrease from an outer portion of the surrounding impact absorption layer to an inner portion of the surrounding impact absorption layer.

The width of the plurality of impact-absorbing opening lines may decrease from the outer portion of the surrounding impact absorption layer to the inner portion of the surrounding impact absorption layer.

The opening line interval between the plurality of impact-absorbing opening lines may increase from the outer portion of the surrounding impact absorption layer to the inner portion of the surrounding impact absorption layer.

The impact absorption agent in the center impact absorption layer may include a high density impact absorption agent, and the impact absorption agent in the surrounding impact absorption layer may include a low density impact absorption agent.

The low density impact absorption agent may be included in the pact absorption layer from an outer portion of the surrounding impact absorption layer to an inner portion of the surrounding impact absorption layer.

The high density impact absorption agent may include one selected from polyethylene terephthalate (PET), polyurethane, polystyrene, and polypropylene.

The low density impact absorption agent may include one selected from porous polypropylene, porous polyurethane, and porous acryl.

The surrounding impact absorption layer may overlap the sealant, and the width of the surrounding impact absorption layer may be larger than the width of the sealant.

Accordingly, in the organic light emitting diode (OLED) display according to an exemplary embodiment, the area ratio of the impact absorption agent formed in the impact absorption layer increases from the position corresponding to the surrounding portion of the display substrate to the position corresponding to the center of the display substrate such that the impact absorption ratio of the outer portion of the surrounding impact absorption layer is higher than the impact absorption ratio of the center impact absorption layer, and accordingly, damage to the surrounding portion of the display substrate that is weak against external impact may be prevented.

DETAILED DESCRIPTION

Figure 1:
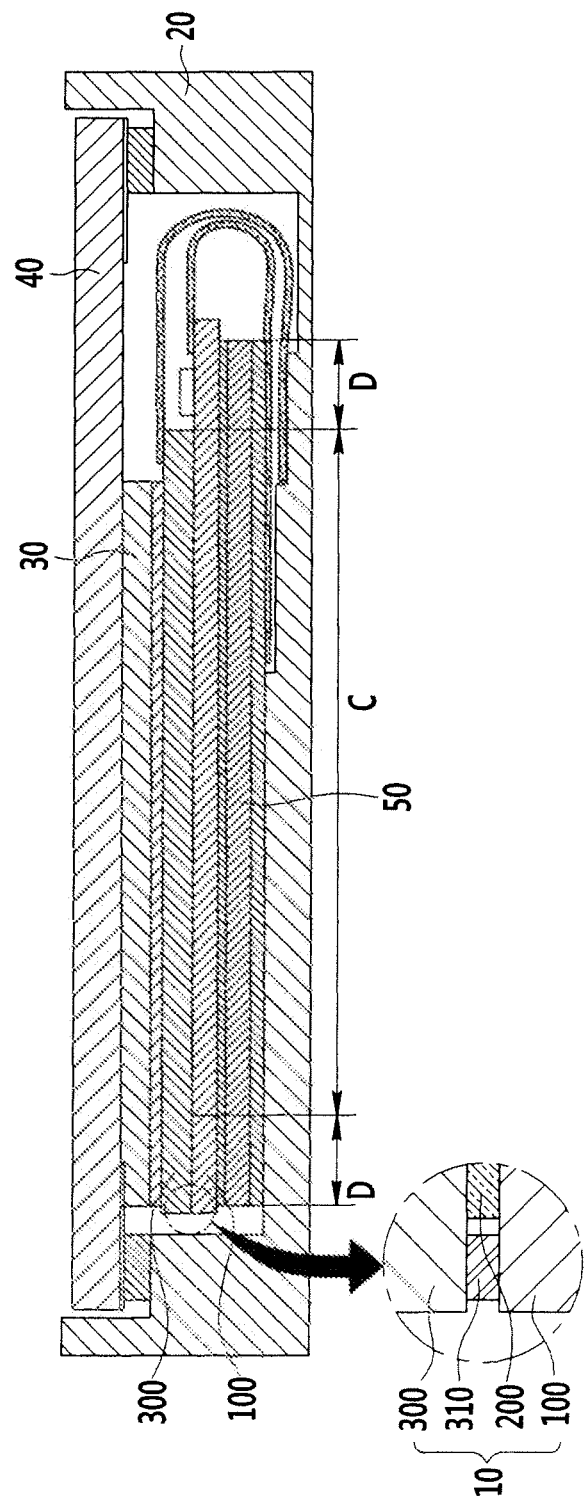
FIG. 1 is a cross-sectional view of an organic light emitting diode (OLED) display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In order to clarify layers and regions, thicknesses and sizes thereof are exemplarily illustrated and thus the present invention is not limited thereto.

In the drawings, the thickness of layers, films, panels, regions, etc., are exaggerated for clarity. In addition, in order to clarify some layers and some regions, thicknesses and sizes thereof are enlarged in the drawings. It will be understood that when an element such as a layer, film, region, or substrate is referred to as being "on" another element, it can be directly on the other element, or one or more intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element and does not imply being necessarily positioned on the top on the basis of a gravity direction.

Now, an organic light emitting diode (OLED) display according to a first exemplary embodiment will be described with reference to FIG. 1 to FIG. 5.

Figure 2:
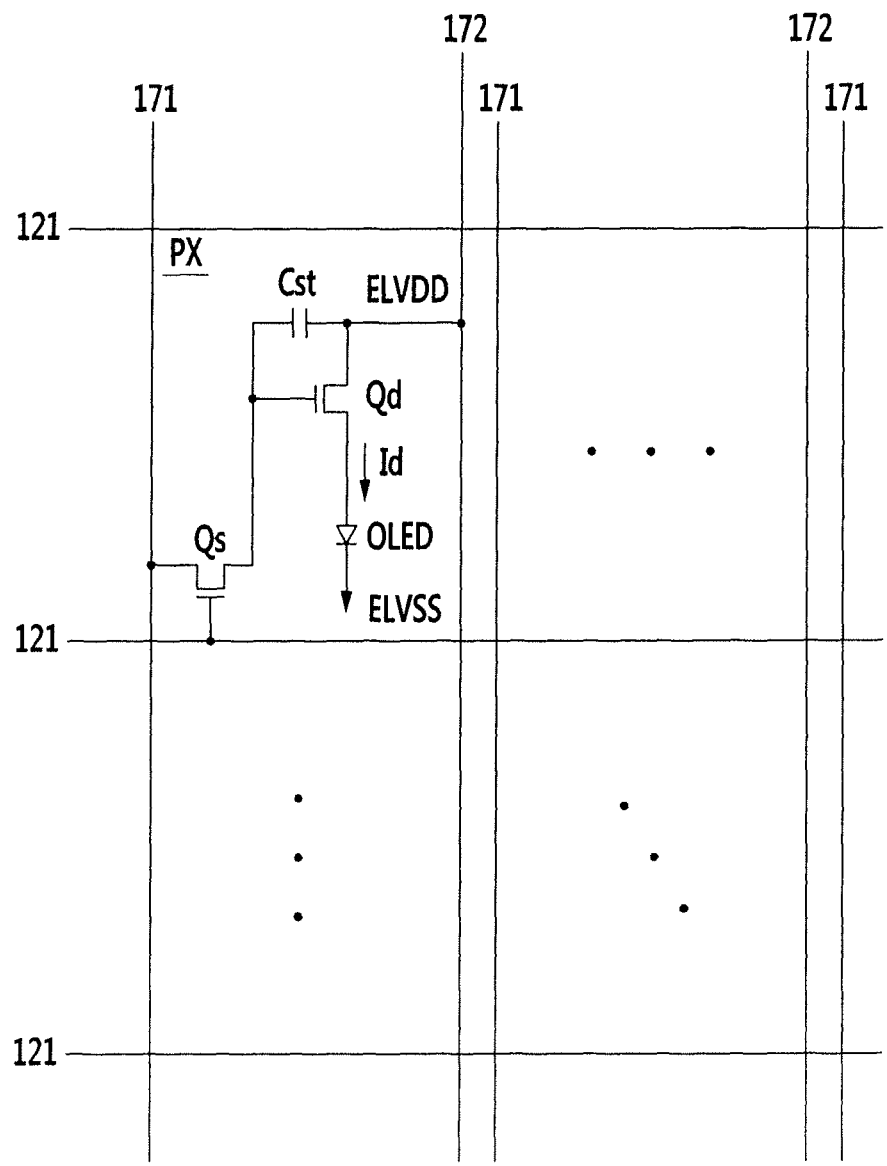
FIG. 2 is an equivalent circuit of the organic light emitting diode (OLED) display according to the first exemplary embodiment.

FIG. 2 is an equivalent circuit of the organic light emitting diode (OLED) display according to the first exemplary embodiment, and FIG. 1 is a cross-sectional view of the organic light emitting diode (OLED) display according to the first exemplary embodiment.

As shown in FIG. 1, an organic light emitting diode (OLED) display according to the first exemplary embodiment includes an organic light emitting panel 10 displaying an image, an exterior frame 20 protecting the organic light emitting panel 10 and receiving (housing) the organic light emitting panel 10 therein, a polarizing plate 30 attached on the organic light emitting panel 10 and preventing or reducing reflection of external light, a window 40 attached on the polarizing plate 30 and protecting the organic light emitting panel 10, and an impact absorption layer 50 installed between the exterior frame 20 and the organic light emitting panel 10 and protecting against an external impact.

The organic light emitting panel 10 includes a display substrate 100, an organic light emitting element 200 formed on the display substrate 100, a sealing member 300 covering the organic light emitting element 200, and a sealant 310 formed between a surrounding portion of the display substrate 100 and a surrounding portion of the sealing member 300. The impact absorption layer 50 is formed under the display substrate 100.

As shown in FIG. 2, the organic light emitting element 200 of the organic light emitting diode (OLED) display according to the first exemplary embodiment includes a plurality of signal lines 121, 171, and 172, and a plurality of pixels PX connected thereto and arranged substantially in a matrix.

The signal lines include a plurality of gate signal lines 121 for transmitting scanning signals (or gate signals), a plurality of data lines 171 for transmitting data signals, and a plurality of driving voltage lines 172 for transmitting a driving voltage (ELVDD). The gate signal lines 121 extend substantially in a row direction and are substantially parallel to each other, and the data lines 171 extend substantially in a column direction and are substantially parallel to each other.

Each pixel PX includes a switching thin film transistor Qs, a driving thin film transistor Qd, a storage capacitor Cst, and an organic light emitting diode (OLED).

The thin film switching transistor Qs includes a control terminal, an input terminal, and an output terminal, in which the control terminal is connected to the scanning signal line 121, the input terminal is connected to the data line 171, and the output terminal is connected to the thin film driving transistor Qd. The thin film switching transistor Qs transmits the data signal received from the data line 171 to the driving transistor Qd in response to the scanning signal received from the scanning signal line 121.

The thin film driving transistor Qd also includes a control terminal, an input terminal, and an output terminal, in which the control terminal is connected to the thin film switching transistor Qs, the input terminal is connected to the driving voltage line 172, and the output terminal is connected to the organic light emitting element (OLED). The thin film driving transistor Qd applies an output current Id of which the magnitude varies according to the voltage applied between the control terminal and the output.

The storage capacitor Cst is connected between the control terminal and the input terminal of the driving thin film transistor (Qd). The storage capacitor Cst stores the data signal applied to the control terminal of the driving transistor Qd and maintains the stored data signal even after the thin film switching transistor Qs is turned off.

The organic light emitting diode (OLED) includes an anode connected to the output terminal of the driving thin film transistor (Qd) and a cathode connected to a common voltage (ELVSS). The organic light emitting element (OLED) emits light of which the intensity is varied according to the output current Id of the driving thin film transistor (Qd) thereby displaying an image.

The switching thin film transistor (Qs) and the driving thin film transistor (Qd) are n-channel field effect transistors (FETs). However, at least one of the switching thin film transistor (Qs) and the driving thin film transistor (Qd) may be a p-channel field effect transistor. Also, a connection relation of the thin film transistors (Qs, Qd), the capacitor Cst, and the organic light emitting diode (OLED) may be changed.

Next, the impact absorption layer will be described with reference to FIG. 3 to FIG. 5.

Figure 3:
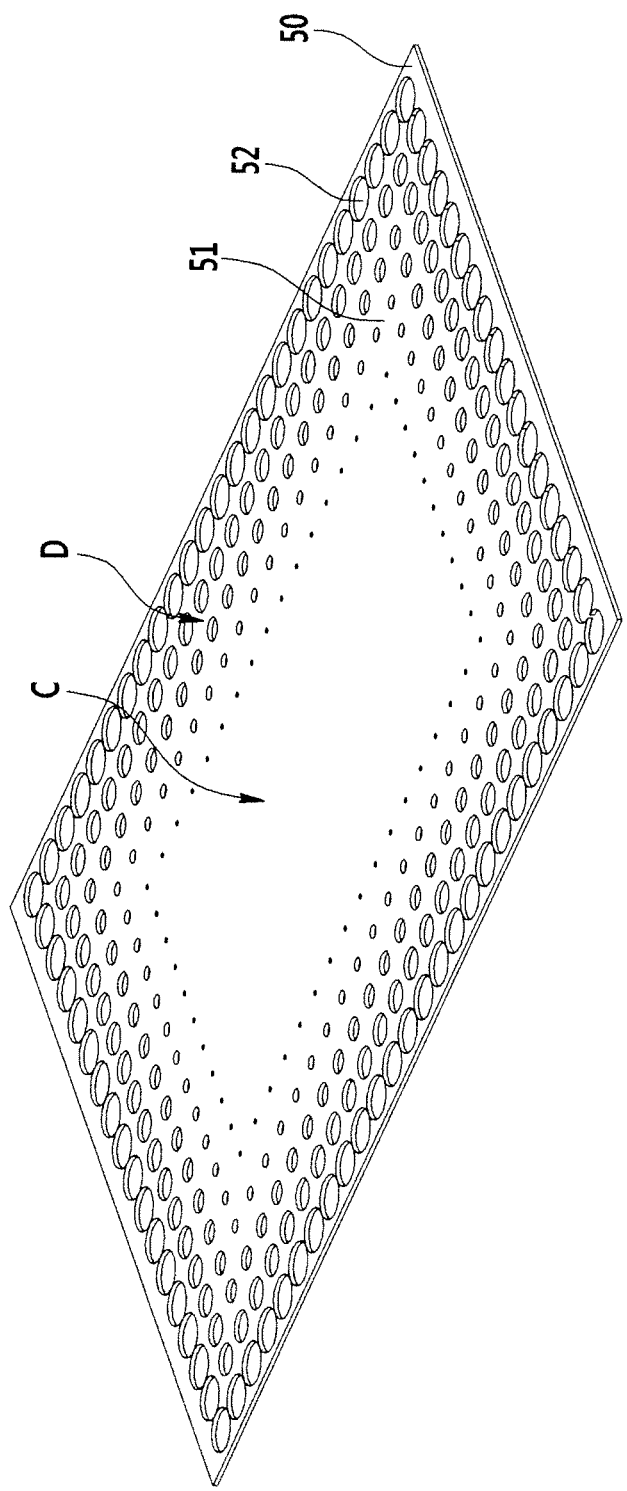
FIG. 3 is a perspective view of an impact absorption layer of the organic light emitting diode (OLED) display according to the first exemplary embodiment.
Figure 4:
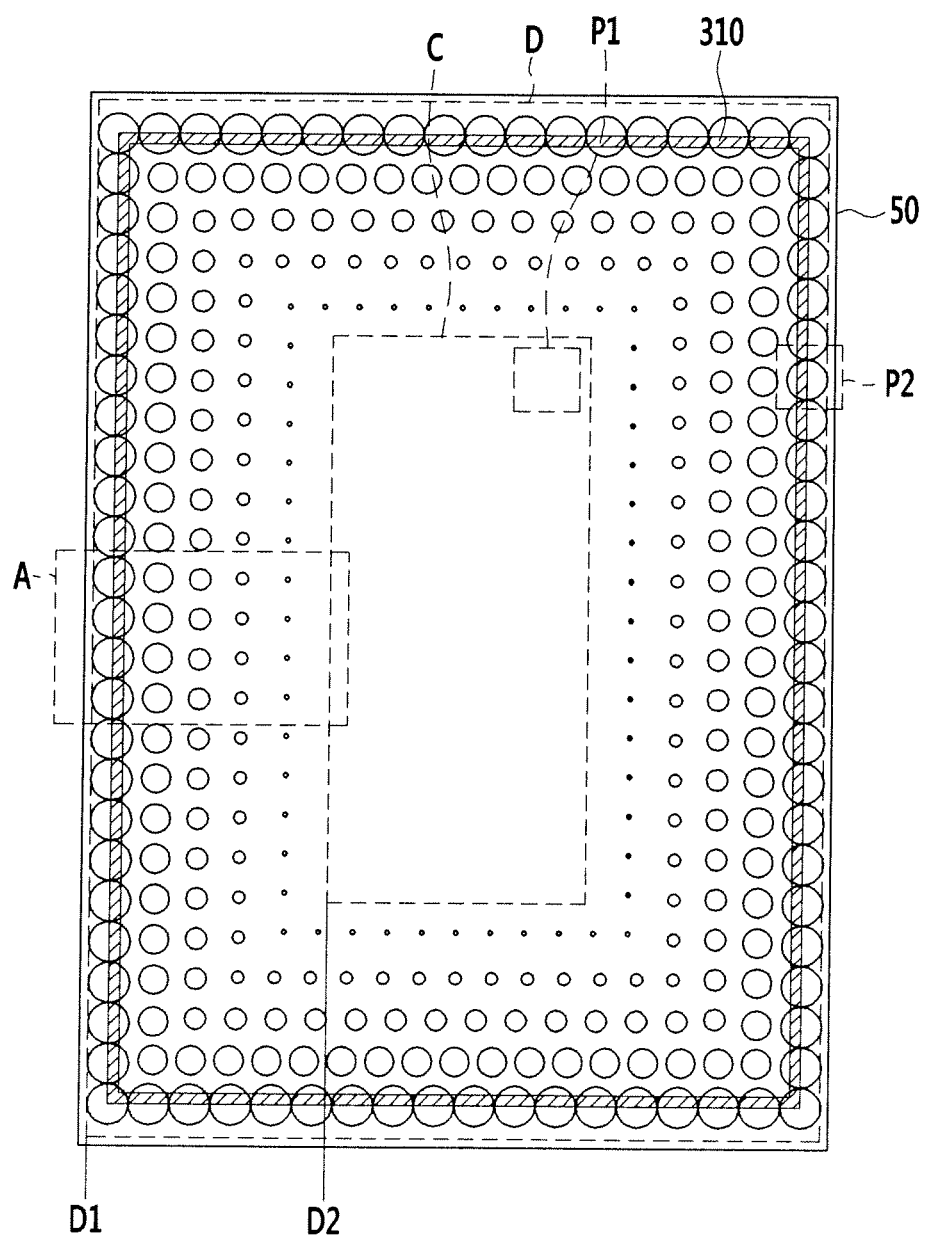
FIG. 4 is a top plan view of the impact absorption layer of FIG. 3.
Figure 5:
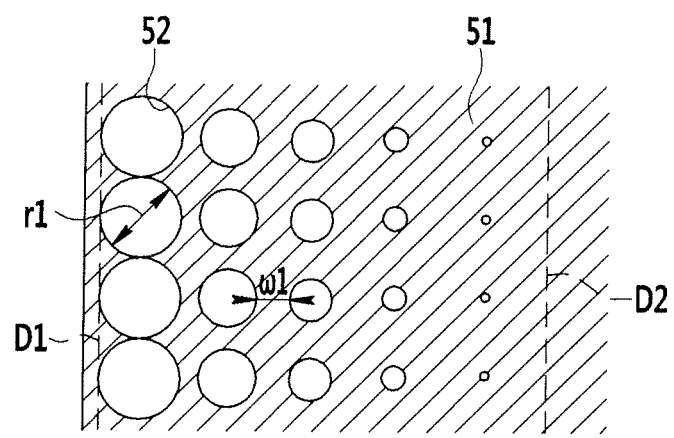
FIG. 5 is an enlarged view of a portion A of FIG. 4.

FIG. 3 is a perspective view of an impact absorption layer of the organic light emitting diode (OLED) display according to the first exemplary embodiment, FIG. 4 is a top plan view of the impact absorption layer of FIG. 3, and FIG. 5 is an enlarged view of a portion A of FIG. 4.

As shown in FIG. 3 to FIG. 5, the impact absorption layer 50 includes a center impact absorption layer (C) formed at a position corresponding to a center of the display substrate 100, and a surrounding impact absorption layer (D) formed at a position corresponding to a surrounding portion of the display substrate 100 having a higher impact absorption ratio than the center impact absorption layer (C).

The center impact absorption layer (C) includes an impact absorption agent 51 made of a porous polymer, and the surrounding impact absorption layer (D) includes the impact absorption agent 51 and an impact-absorbing opening 52 formed at the impact absorption agent 51. The impact absorption agent 51 elongates an impact time from the outside to smooth a maximum impact amount thereby preventing damage to the organic light emitting diode (OLED) display, and as an area occupied with the impact-absorbing opening 52 is increased in the impact absorption agent 51, the impact absorption amount is increased. The impact-absorbing opening 52 may be a plurality of impact-absorbing holes 52.

The area ratio of the plurality of impact-absorbing holes 52 formed in the surrounding impact absorption layer (D) may decrease from the outer portion D1 of the surrounding impact absorption layer (D) to the inner portion D2 of the surrounding impact absorption layer (D).

Also, the size r1 of the plurality of impact-absorbing holes 52 may decrease from the outer portion D1 of the surrounding impact absorption layer (D) to the inner portion D2 of the surrounding impact absorption layer (D), and a hole interval w1 between a plurality of impact-absorbing hole 52 may increase from the outer portion D1 of the surrounding impact absorption layer (D) to the inner portion D2 of the surrounding impact absorption layer (D).

Accordingly, the area ratio of the impact absorption agent 51 in the impact absorption layer 50 may increase from the position corresponding to the surrounding portion of the display substrate 100 to the center of the display substrate 100. For example, as shown in FIG. 4, the area ratio of the impact absorption agent 51 in the portion P1 of the center impact absorption layer (C) without the impact-absorbing hole 52 is 100%, and the area ratio of the impact absorption agent 51 in the portion P2 of the surrounding impact absorption layer (D) formed with the largest impact-absorbing hole 52 is about 50%, so the area ratio of the impact absorption agent 51 in the impact absorption layer 50 may be increased from the outer portion D1 of the surrounding impact absorption layer (D) to the inner portion D2 of the surrounding impact absorption layer (D).

As described above, the area ratio of the impact absorption agent 51 in the impact absorption layer 50 may increase from the outer portion D1 of the surrounding impact absorption layer (D) to the inner portion D2 of the surrounding impact absorption layer (D), and the area ratio of the impact absorption agent 51 in the center impact absorption layer (C) may be larger than at the inner portion D2 of the surrounding impact absorption layer (D).

Accordingly, the impact absorption ratio of the outer portion D1 of the surrounding impact absorption layer (D) is higher than the impact absorption ratio of the inner portion D2 of the surrounding impact absorption layer (D) such that damage to the surrounding portion of the display substrate 100 that is weak against the external impact may be prevented.

Here, the surrounding impact absorption layer (D) overlaps the sealant 310, and the width of the surrounding impact absorption layer (D) is larger than the width of the sealant 310 such that the surrounding impact absorption layer (D) under the sealant 310 having the high impact absorption ratio absorbs the external impact even when the external impact is concentrated at the sealant 310, thereby preventing the portion near the sealant 310 and the sealant 310 from being damaged.

Meanwhile, in the first exemplary embodiment, the impact-absorbing openings 52 are the plurality of impact-absorbing holes 52; however a second exemplary embodiment including the impact-absorbing openings 52 formed with a plurality of impact-absorbing opening lines 52 is possible.

Figure 6:
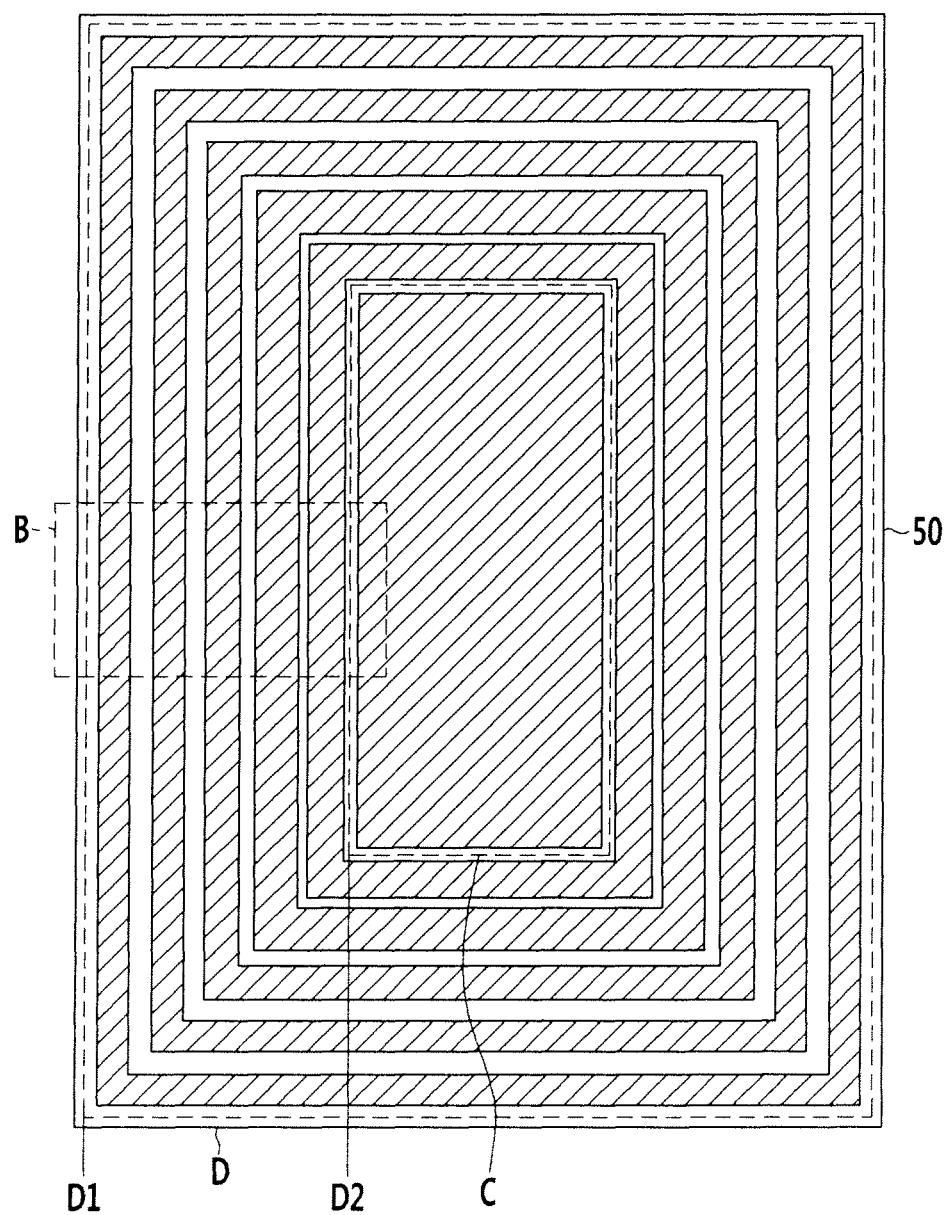
FIG. 6 is a top plan view of an impact absorption layer of an organic light emitting diode (OLED) display according to a second exemplary embodiment.
Figure 7:
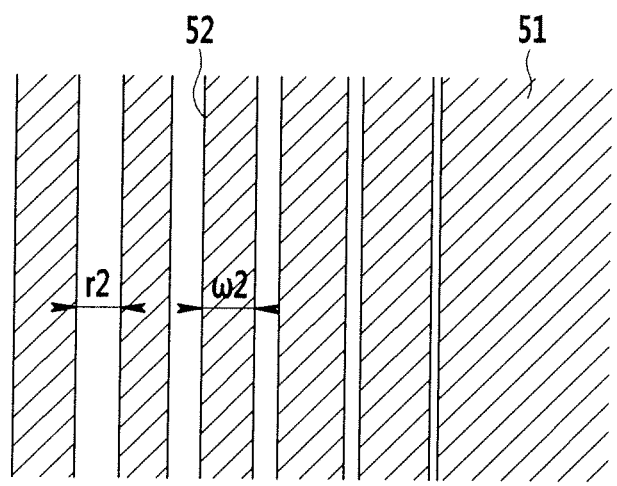
FIG. 7 is an enlarged view of a portion B of FIG. 6.

FIG. 6 is a top plan view of an impact absorption layer of an organic light emitting diode (OLED) display according to a second exemplary embodiment, and FIG. 7 is an enlarged view of a portion B of FIG. 6.

The second exemplary embodiment shown in FIG. 6 and FIG. 7 is substantially equivalent to the first exemplary embodiment shown in FIG. 1 to FIG. 5 except for a structure of the impact-absorbing openings such that the repeated description is omitted.

As shown in FIG. 1, FIG. 6, and FIG. 7, the impact absorption layer 50 includes a center impact absorption layer (C) formed at the center of the display substrate 100, and a surrounding impact absorption layer (D) formed at the surrounding portion of the display substrate 100 and having a higher impact absorption ratio than the center impact absorption layer (C). The center impact absorption layer (C) includes the impact absorption agent 51 made of a porous polymer, and the surrounding impact absorption layer (D) includes the impact absorption agent 51 and the impact-absorbing openings 52 formed at the impact absorption agent 51. Here, the impact-absorbing opening 52 may be a plurality of linear impact-absorbing opening lines 52, and a plurality of impact-absorbing opening lines 52 may be separated in parallel.

The area ratio of a plurality of impact-absorbing lines 52 formed in surrounding impact absorption layer (D) may decrease from the outer portion D1 of the surrounding impact absorption layer (D) to the inner portion D2 of the surrounding impact absorption layer (D).

Also, the width r2 of a plurality of impact-absorbing opening lines 52 may decrease from the outer portion D1 of the surrounding impact absorption layer (D) to the inner portion D2 of the surrounding impact absorption layer (D), and the opening line interval w2 between a plurality of impact-absorbing opening lines 52 may increase from the outer portion D1 of the surrounding impact absorption layer (D) to the inner portion D2 of the surrounding impact absorption layer (D).

Accordingly, the area ratio of the impact absorption agent 51 in the impact absorption layer 50 may increase from the position corresponding to the surrounding portion of the display substrate 100 to the center of the display substrate 100. In more detail, the area ratio of the impact absorption agent 51 in the impact absorption layer 50 may increase from the outer portion D1 of the surrounding impact absorption layer (D) to the inner portion D2 of the surrounding impact absorption layer (D), and the area ratio of the impact absorption agent 51 in the center impact absorption layer (C) may be larger than at the inner portion D2 of the surrounding impact absorption layer (D). Accordingly, the impact absorption ratio of the outer portion D1 of the surrounding impact absorption layer (D) is higher than the impact absorption ratio of the inner portion D2 of the surrounding impact absorption layer (D) such that damage to the surrounding portion of the display substrate 100 that is weak against external impact may be prevented.

Here, the surrounding impact absorption layer (D) overlaps the sealant 310, and the width of the surrounding impact absorption layer (D) is larger than the width of the sealant 310 such that the surrounding impact absorption layer (D) under the sealant 310 having the high impact absorption ratio absorbs the external impact even when the external impact is concentrated at the sealant 310, thereby preventing the portion near the sealant 310 and the sealant 310 from being damaged.

Meanwhile, in the first exemplary embodiment, the impact-absorbing opening 52 is formed to increase the impact absorption ratio of the surrounding impact absorption layer (D), however the surrounding impact absorption layer may be formed with the impact absorption agent of a low density to increase the impact absorption ratio of the surrounding impact absorption layer (D) in the third exemplary embodiment.

Figure 8:
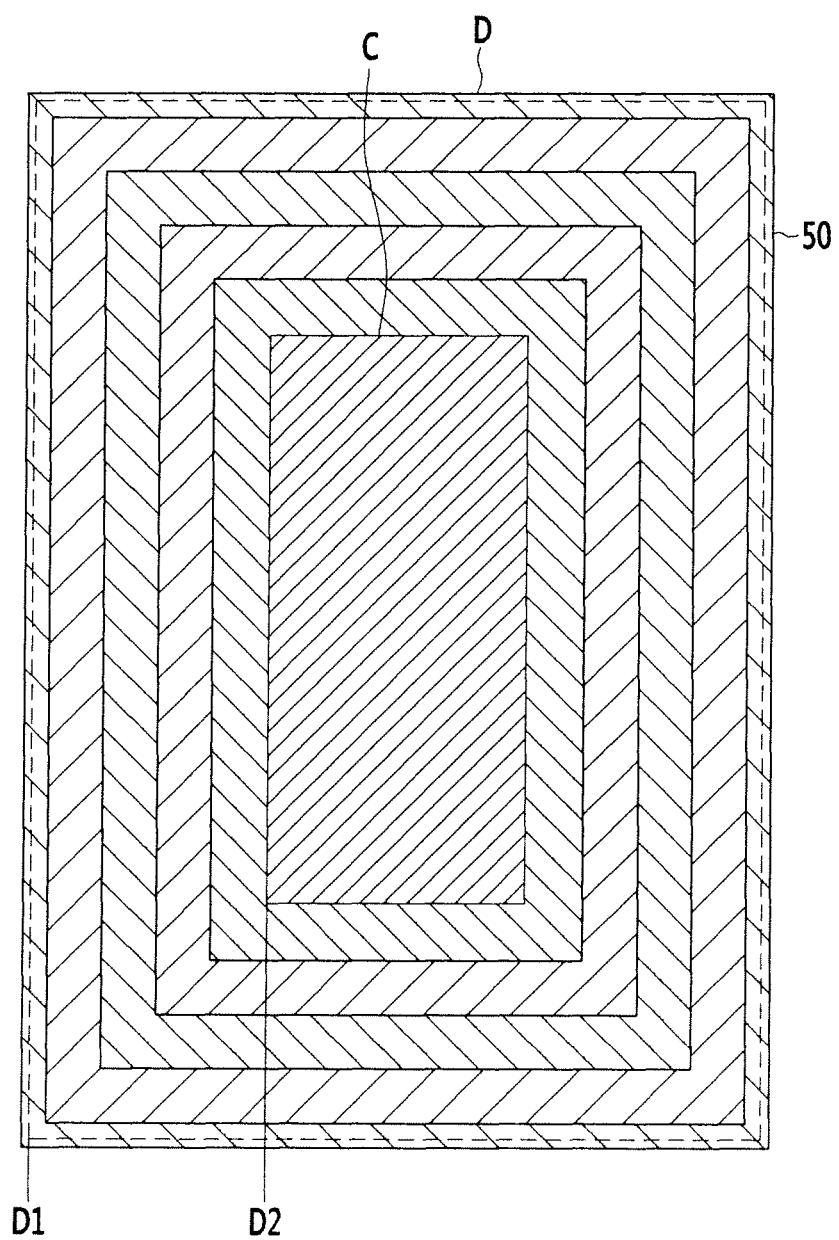
FIG. 8 is a top plan view of an impact absorption layer of an organic light emitting diode (OLED) display according to a third exemplary embodiment.

FIG. 8 is a top plan view of an impact absorption layer of an organic light emitting diode (OLED) display according to a third exemplary embodiment.

The third exemplary embodiment shown in FIG. 8 is substantially equivalent to the first exemplary embodiment shown in FIG. 1 to FIG. 5 except for a structure of the impact absorption layer such that the repeated description is omitted.

As shown in FIG. 1 and FIG. 8, the impact absorption layer 50 includes a center impact absorption layer (C) formed at the position corresponding to the center of the display substrate 100, and a surrounding impact absorption layer (D) formed at the position corresponding to the surrounding portion of the display substrate 100 and having a higher impact absorption ratio than the center impact absorption layer (C). The impact absorption agent in the center impact absorption layer (C) includes a high density impact absorption agent made of, e.g., a polymer of a high density, and the impact absorption agent in the surrounding impact absorption layer (D) includes a low density impact absorption agent made of, e.g., a porous polymer of a low density. Also, the low density impact absorption agent is included in the impact absorption layer from the outer portion D1 of the surrounding impact absorption layer (D) to the inner portion D2 of the surrounding impact absorption layer (D).

The high density impact absorption agent may be one of polyethylene terephthalate (PET), polyurethane, polystyrene, and polypropylene, and the low density impact absorption agent may be one of porous polypropylene, porous polyurethane, and porous acryl.

Accordingly, the material density or area ratio of the impact absorption agent 51 in the impact absorption layer 50 may increase from the position corresponding to the surrounding portion of the display substrate 100 to the center of the display substrate 100. In more detail, the impact absorption agent of the low density is included closer to the inner portion D2 of the surrounding impact absorption layer (D) from the outer portion D1 of the surrounding impact absorption layer (D) such that the area ratio of the impact absorption agent 51 in the impact absorption layer 50 may increase from the outer portion D1 of the surrounding impact absorption layer (D) to the inner portion D2 of the surrounding impact absorption layer (D). Also, the center impact absorption layer (C) includes the high density impact absorption agent and the surrounding impact absorption layer (D) includes the low density impact absorption agent such that the area ratio of the impact absorption agent 51 in the center impact absorption layer (C) may be larger than the inner portion D2 of the surrounding impact absorption layer (D).

Accordingly, the impact absorption ratio of the outer portion D1 of the surrounding impact absorption layer (D) is higher than the impact absorption ratio of the center impact absorption layer (C) such that damage to the surrounding portion of the display substrate 100 that is weak against external impact may be prevented.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SYMBOLS

| 50: impact absorption layer | 51: impact absorption agent |
|---|---|
| 52: impact-absorbing opening | 310: sealant |
| C: center impact absorption layer | D: surrounding impact absorption layer |

What is claimed is:

1. An organic light emitting diode (OLED) display comprising:
    a display substrate;
    an organic light emitting element on the substrate;
    a sealing member covering the organic light emitting element;
    a sealant between a surrounding portion of the display substrate and a surrounding portion of the sealing member; and
    an impact absorption layer under the display substrate,
    wherein an area ratio of an impact absorption agent in the impact absorption layer increases from the surrounding portion of the display substrate to a center portion of the display substrate.

2. The organic light emitting diode (OLED) display of claim 1, wherein the impact absorption layer comprises
    a center impact absorption layer at a position corresponding to the center portion of the display substrate, and
    a surrounding impact absorption layer at a position corresponding to the surrounding portion of the display substrate and having a higher impact absorption ratio than the center impact absorption layer.

3. The organic light emitting diode (OLED) display of claim 2, wherein the center impact absorption layer comprises the impact absorption agent, and
    the surrounding impact absorption layer comprises the impact absorption agent and an impact-absorbing opening formed at the impact absorption agent.

4. The organic light emitting diode (OLED) display of claim 3, wherein the impact-absorbing opening is a plurality of impact-absorbing holes.

5. The organic light emitting diode (OLED) display of claim 4, wherein the area ratio of the plurality of impact-absorbing holes in the surrounding impact absorption layer decreases from an outer portion of the surrounding impact absorption layer to an inner portion of the surrounding impact absorption layer.

6. The organic light emitting diode (OLED) display of claim 4, wherein the size of the plurality of impact-absorbing holes decreases from an outer portion of the surrounding impact absorption layer to an inner portion of the surrounding impact absorption layer.

7. The organic light emitting diode (OLED) display of claim 4, wherein the hole interval between the plurality of impact-absorbing holes increases from an outer portion of the surrounding impact absorption layer to an inner portion of the surrounding impact absorption layer.

8. The organic light emitting diode (OLED) display of claim 3, wherein the impact-absorbing opening is a plurality of impact-absorbing opening lines.

9. The organic light emitting diode (OLED) display of claim 8, wherein the area ratio of the plurality of impact-absorbing opening lines in the surrounding impact absorption layer decreases from an outer portion of the surrounding impact absorption layer to an inner portion of the surrounding impact absorption layer.

10. The organic light emitting diode (OLED) display of claim 8, wherein the width of the plurality of impact-absorbing opening lines decreases from an outer portion of the surrounding impact absorption layer to an inner portion of the surrounding impact absorption layer.

11. The organic light emitting diode (OLED) display of claim 8, wherein the opening line interval between the plurality of impact-absorbing opening lines increases from an outer portion of the surrounding impact absorption layer to an inner portion of the surrounding impact absorption layer.

12. The organic light emitting diode (OLED) display of claim 2, wherein the impact absorption agent in the center impact absorption layer includes a high density impact absorption agent, and the impact absorption agent in the surrounding impact absorption layer includes a low density impact absorption agent.

13. The organic light emitting diode (OLED) display of claim 12, wherein the low density impact absorption agent is included in the impact absorption layer from an outer portion of the surrounding impact absorption layer to an inner portion of the surrounding impact absorption layer.

14. The organic light emitting diode (OLED) display of claim 13, wherein the high density impact absorption agent comprises one selected from polyethylene terephthalate (PET), polyurethane, polystyrene, and polypropylene.

15. The organic light emitting diode (OLED) display of claim 13, wherein the low density impact absorption agent comprises one selected from porous polypropylene, porous polyurethane, and porous acryl.

16. The organic light emitting diode (OLED) display of claim 2, wherein the surrounding impact absorption layer overlaps the sealant.

17. The organic light emitting diode (OLED) display of claim 16, wherein the width of the surrounding impact absorption layer is larger than the width of the sealant.

* * * * *